US010651337B2

(12) United States Patent
    An

(10) Patent No.: US 10,651,337 B2
(45) Date of Patent: May 12, 2020

(54) SUPPORTING SUBSTRATE FOR SEMICONDUCTOR DEVICE, SEMICONDUCTOR APPARATUS COMPRISING THE SAME, AND METHOD FOR MANUFACTURING THE SAME

(71) Applicant: Sang Jeong An, Gyeonggi-do (KR)

(72) Inventor: Sang Jeong An, Gyeonggi-do (KR)

( * ) Notice: Subject to any disclaimer, the term of this patent is extended or adjusted under 35 U.S.C. 154(b) by 0 days.

(21) Appl. No.: 15/521,466

(22) PCT Filed: Oct. 22, 2015

(86) PCT No.: PCT/KR2015/011193
    § 371 (c)(1),
    (2) Date: Apr. 24, 2017

(87) PCT Pub. No.: WO2016/064216
    PCT Pub. Date: Apr. 28, 2016

(65) Prior Publication Data
    US 2017/0317230 A1    Nov. 2, 2017

(30) Foreign Application Priority Data

Oct. 22, 2014  (KR) .................. 10-2014-0143584
Feb. 6, 2015   (KR) .................. 10-2015-0018962

(51) Int. Cl.
    *H01L 33/00*        (2010.01)
    *H01L 33/48*        (2010.01)
    (Continued)

(52) U.S. Cl.
    CPC ...... *H01L 33/0079* (2013.01); *H01L 33/0075* (2013.01); *H01L 33/405* (2013.01);
    (Continued)

(58) Field of Classification Search
    None
    See application file for complete search history.

(56) References Cited

U.S. PATENT DOCUMENTS 7,943,488 B2    5/2011  Yonehara
2005/0170561 A1* 8/2005  Huang ............... H01L 21/50
                                                438/127
(Continued)

FOREIGN PATENT DOCUMENTS

JP   2007-150229    6/2007
JP   2013-069843    4/2013
(Continued)

OTHER PUBLICATIONS

International Search Report (ISR) dated Feb. 25, 2016 in PCT/KR2015/011193 with English translation.

*Primary Examiner* — Khaja Ahmad
(74) *Attorney, Agent, or Firm* — Harness, Dickey & Pierce, P.L.C.

(57) ABSTRACT

The present disclosure relates to a method for manufacturing a semiconductor light emitting device, a semiconductor device including the supporting substrate, and a method for manufacturing the supporting substrate, in which the method includes: providing a first substrate having a first face and a second face opposite to the first face; forming a groove in the first substrate in a direction from the first face to the second face; forming a conducting part in the groove; bonding a second substrate to the first face of the first substrate; and forming, on the second face, a first conducting pad to be in electrical communication with the conducting part.

4 Claims, 18 Drawing Sheets

(51) Int. Cl.
    *H01L 33/40*    (2010.01)
    *H01L 33/62*    (2010.01)

(52) U.S. Cl.
    CPC ............ *H01L 33/486* (2013.01); *H01L 33/62* (2013.01); *H01L 2224/16225* (2013.01); *H01L 2224/48091* (2013.01); *H01L 2224/49107* (2013.01); *H01L 2224/73265* (2013.01); *H01L 2224/97* (2013.01); *H01L 2924/181* (2013.01); *H01L 2933/0033* (2013.01); *H01L 2933/0066* (2013.01)

(56) References Cited

U.S. PATENT DOCUMENTS

| | | | |
|---|---|---|---|
| 2006/0261364 A1* | 11/2006 | Suehiro | H01L 33/56 257/100 |
| 2007/0057410 A1 | 3/2007 | Chan et al. | |
| 2007/0284729 A1 | 12/2007 | Kwon et al. | 257/700 |
| 2010/0079050 A1 | 4/2010 | Kamamori et al. | 313/113 |
| 2011/0227226 A1* | 9/2011 | Chiang | H01L 23/481 257/751 |
| 2012/0074441 A1 | 3/2012 | Seo et al. | 257/91 |
| 2012/0248481 A1 | 10/2012 | Seo | 257/98 |
| 2012/0319149 A1* | 12/2012 | Su | H01L 33/0095 257/98 |
| 2013/0059418 A1* | 3/2013 | Chiang | H01L 21/486 438/113 |
| 2013/0295699 A1* | 11/2013 | Liu | H01L 22/14 438/17 |
| 2014/0017837 A1 | 1/2014 | Kim et al. | 438/33 |
| 2014/0147970 A1* | 5/2014 | Kim | H01L 25/50 438/107 |
| 2014/0186979 A1 | 7/2014 | Tu et al. | |
| 2014/0213002 A1 | 7/2014 | Cho et al. | 438/27 |
| 2014/0242752 A1* | 8/2014 | Park | H01L 24/95 438/108 |
| 2014/0246786 A1* | 9/2014 | Kim | H01L 25/16 257/774 |
| 2014/0361426 A1* | 12/2014 | Moon, II | H01L 24/14 257/737 |
| 2015/0194331 A1* | 7/2015 | Bai | H01L 21/6835 257/783 |

FOREIGN PATENT DOCUMENTS

| | | | | |
|---|---|---|---|---|
| KR | 10-2010-0036176 | 4/2010 | ............ | H01L 33/62 |
| KR | 10-2012-0039587 | 4/2012 | | |
| KR | 10-2013-0030283 | 3/2013 | ............ | H01L 33/36 |
| KR | 10-2014-0095794 | 8/2014 | | |

* cited by examiner

US 10,651,337 B2

SUPPORTING SUBSTRATE FOR SEMICONDUCTOR DEVICE, SEMICONDUCTOR APPARATUS COMPRISING THE SAME, AND METHOD FOR MANUFACTURING THE SAME

CROSS-REFERENCE TO RELATED APPLICATIONS

This application is a national phase application of PCT Application No. PCT/KR2015/011193, filed on Oct. 22, 2015, which claims the benefit and priority to Korean Patent Application Nos. 10-2014-0143584, filed Oct. 22, 2014 and 10-2015-0018962, filed Feb. 6, 2015. The entire disclosures of the applications identified in this paragraph are incorporated herein by references.

FIELD

The present disclosure relates generally to a supporting substrate for a semiconductor device, a semiconductor device having the supporting substrate, and a method for manufacturing the supporting substrate. In particular, the present disclosure relates to a semiconductor device supporting substrate to prevent cracking or breaking of the semiconductor device, a semiconductor apparatus having the supporting substrate, and a method for manufacturing the supporting substrate. Within the context herein, the term 'semiconductor device' refers to a semiconductor device using a pn junction, and one example thereof will be semiconductor optical devices (e.g., semiconductor light emitting devices, semiconductor light receiving devices, and so on). Among others, the semiconductor light emitting device is a semiconductor optical device, which generates light by electron-hole recombination, such as, for example, a Group III-nitride semiconductor light emitting device. The Group III-nitride semiconductor is composed of a compound containing Al(x)Ga(y)In(1-x-y)N (0≤x≤1, 0≤y≤1, 0≤x+y≤1). Another example of the semiconductor light emitting device is a GaAs-based semiconductor light emitting device used for emitting red light.

BACKGROUND ART

This section provides background information related to the present disclosure which is not necessarily prior art.

FIG. 1 illustrates an exemplary embodiment of the semiconductor light emitting device chip disclosed in U.S. Pat. No. 7,262,436, which includes a substrate 100, an n-type semiconductor layer 300 grown on the substrate 100, an active layer 400 grown on the n-type semiconductor layer 300, a p-type semiconductor layer 500 grown on the active layer 400, three-layer electrodes 901, 902 and 903 which are formed on the p-type semiconductor layer 500 and serve to reflect light towards the substrate 100, and an electrode 800 which is formed on an exposed etched portion of the n-type (first) semiconductor layer 300 and serves as a bonding pad. The electrode 901 serves as a reflective film, the electrode 902 serves as a barrier, and the electrode 903 serves to facilitate bonding with an external electrode. This semiconductor light emitting chip with the above structure has the electrode 800 and the electrode 903 being directly connected to an SMD type package, PCB (Printed Circuit Board), COB (Chip-on Board), submount (without wire-bonding) or the like, and is called a flip chip.

FIG. 2 illustrates an exemplary embodiment of the semiconductor LED chip disclosed in JP Laid-Open Pub. No. 2006-120913, which includes a substrate 100, a buffer layer 200 grown on the substrate 100, an n-type semiconductor layer 300 grown on the buffer layer 200, an active layer 400 grown on the n-type semiconductor layer 300, a p-type semiconductor layer 500 grown on the active layer 400, a light transmitting conductive layer 600 which is formed on the p-type semiconductor layer 500 and serves to spread current, a p-side bonding pad 700 formed on the light transmitting conductive film 600, and an n-side bonding pad 800 formed on an exposed etched portion of the n-type semiconductor layer 300. In addition, a DBR (Distributed Bragg Reflector) 900 and a metal reflective film 904 are formed on the light transmitting conductive film 600. The n-type semiconductor layer 300 and the p-type semiconductor layer 500 each includes a plurality of layers, and the positions of the n-type and p-type semiconductor layers 300 and 500 may be exchanged. Although not desired, the buffer layer 200 and the light transmitting conductive film 600 may be omitted.

FIG. 3 illustrates an exemplary embodiment of the semiconductor LED chip disclosed in PCT Pub. No. WO2014/014298, which includes a substrate 100, a buffer layer 200 grown on the substrate 100, an n-type semiconductor layer 300 grown on the buffer layer 200, an active layer 400 grown on the n-type semiconductor layer 300, a p-type semiconductor layer 500 grown on the active layer 400, a light transmitting conductive film 600 which is formed on the p-type semiconductor layer 500 and serves to spread current, a non-conductive reflective film 900 (e.g., DBR) which is formed on the light transmitting conductive film 600 and serves to reflect light generated by the active layer 400, and electrodes 700 and 800 formed on the non-conductive reflective film 900. The electrode 700 and the electrode 800 are in electrical communication with the n-type semiconductor 300 and the p-type semiconductor layer 500 through a conducting part 710 and a conducting part 810, respectively.

FIG. 4 illustrates an exemplary embodiment of the semiconductor light emitting device disclosed in JP Laid-Open Pub. No. 2001-358371, which includes a substrate 100, an n-type semiconductor layer 300 grown on the substrate 100, an active layer 400 grown on the n-type semiconductor layer 300, a p-type semiconductor layer 500 grown on the active layer 400, a p-side electrode 700 formed on the p-type semiconductor layer 500, and an n-side electrode 800 formed on an exposed etched portion of the n-type semiconductor layer 300. An insulating film 9 is provided between the electrode 700 and the electrode 800. This semiconductor light emitting device includes, in addition to a semiconductor LED chip, a body 1, a read frame 2, 3 formed on the body 1, a mold 5 forming a cavity 4 on the lead frame 2, 3, and an encapsulant 1000 encompassing the semiconductor LED chip. The encapsulant 1000 may include a phosphor, a light scattering agent, and the like. The electrodes 700 and 800 are fixed to the lead frame 2 and 3 by means of a bonding layer 7. While the electrodes 700 and 800 and the lead frames 2 and 3 can be electrically connected by bonding with a stud bump or conductive paste, or by soldering or eutectic bonding, the bonding methods are not particularly limited thereto.

FIG. 5 illustrates an exemplary embodiment of a semiconductor light emitting device in the prior art, in which a substrate 100 of a semiconductor LED chip is electrically connected to a lead frame 3 by means of a wire 8, while the substrate is already being fixed to a lead frame 2. When wire bonding is applied as in this case and heat is produced within the device, the presence of the substrate 100 between a plurality of semiconductor layers 300, 400 and 500 and the lead frames 2 and 3 can protect the plurality of semiconductor layers 300, 400 and 500 from cracking or breaking, even if those semiconductor layers 300, 400 and 500 and the metallic lead frames 2 and 3 exhibit different thermal expansion behaviors. Such a chip is generally referred to as a lateral chip. For instance, for a Group-III nitride semiconductor light emitting device, an overall thickness of the plurality of semiconductor layers 300, 400 and 500 is typically not greater than 10 μm, and a thickness of the substrate 100 (e.g., sapphire substrate) ranges from 80 to 150 μm.

Referring again to FIG. 4, when the semiconductor LED chip is a flip chip bonded, the plurality of semiconductor layers 300, 400 and 500 and the lead frames 2 and 3 are arranged directly facing each other, and if the metallic lead frames 2 and 3 expand due to heat being generated, those semiconductor layers 300, 400 and 500 are highly likely to crack or break. Considering that there has been an increasing demand for flip chips operable with low current, instead of lateral chips, over a broad range of applications, the risk of the semiconductor layers 300, 400 and 500 being cracked or broken will increase as more heat is generated within a device that has a high-current (i.e. high-power) chip.

DISCLOSURE

Technical Problem

The problems to be solved by the present disclosure will be described in the latter part of the best mode for carrying out the invention.

Technical Solution

This section provides a general summary of the present disclosure and is not a comprehensive disclosure of its full scope or all of its features.

According to one aspect of the present disclosure, there is provided a method for manufacturing a supporting substrate for a semiconductor device, the method including: providing a first substrate having a first face and a second face opposite to the first face; forming a groove in the first substrate in a direction from the first face to the second face; forming a conducting part in the groove; bonding a second substrate to the first face of the first substrate; and forming, on the second face, a first conducting pad to be in electrical communication with the conducting part.

According to another aspect of the present disclosure, there is provided a method for manufacturing a supporting substrate for a semiconductor device, the method including: providing a first substrate having a first face and a second face opposite to the first face; forming a groove in the first substrate in a direction from the first face to the second face; forming a conducting part in the groove; forming at least one conducting pad on the conducting part; and bonding a second substrate to the first face of the first substrate.

According to another aspect of the present invention, there is provided a semiconductor apparatus including: a semiconductor device grown using a Group-III nitride semiconductor having a first thermal expansion coefficient as a growth substrate; and a first substrate, which is bonded to the semiconductor device and has a second thermal expansion coefficient different from the first thermal expansion coefficient by 2 ppm or less, with the first substrate having a conducting part adapted to pass through the first substrate so as to provide the semiconductor device with an electrical path.

According to another aspect of the present disclosure, there is provided a semiconductor apparatus including: a semiconductor device grown using a growth substrate made from GaN; and a first substrate, which is made from AlN and bonded to the semiconductor device, with the first substrate having a conducting part adapted to pass through the first substrate so as to provide the semiconductor device with an electrical path.

According to another aspect of the present disclosure, there is provided a semiconductor apparatus including: a semiconductor device grown using a Group-III nitride semiconductor as a growth substrate; and a first substrate, which is bonded to the semiconductor device has a conducting part adapted to pass through the first substrate so as to provide the semiconductor device with an electrical path, with the first substrate having a first face, a second face opposite to the first face, and lateral faces connecting the first face and the second face, wherein the semiconductor device is bonded to the side of the second face, and the lateral faces have a rugged surface away from the first and second faces and resulted from a crack created by laser radiation.

According to another aspect of the present disclosure, there is provided a method for manufacturing a semiconductor apparatus, the method including: providing a first substrate having a first face and a second face opposite to the first face; forming a groove in the first substrate in a direction from the first face to the second face; forming a conducting part in the groove; bonding a second substrate to the first face of the first substrate; and bonding a semiconductor device to the first substrate for electrical communication with the conducting part, with the semiconductor device being grown using a Group-III nitride semiconductor as a growth substrate.

According to another aspect of the present disclosure, there is provided a semiconductor apparatus including: a semiconductor device grown using a Group-III nitride semiconductor having a first thermal expansion coefficient as a growth substrate; and a first substrate, which is bonded to the semiconductor device and has a second thermal expansion coefficient lower than the first thermal expansion coefficient, with the first substrate having a conducting part adapted to pass through the first substrate so as to provide the semiconductor device with an electrical path.

Advantageous Effects

The advantageous effects of the present disclosure will be described in the latter part of the best mode for carrying out the invention.

DETAILED DESCRIPTION

The present disclosure will now be described in detail with reference to the accompanying drawings. The following description is presented for purposes of illustration only and not of limitation as the scope of the invention is defined by the appended claims. For example, the steps mentioned in any of the method or process may be executed in any order and are not necessarily limited to the order provided. Also, any reference to singular includes plural embodiments, and vice versa.

Figure 6:
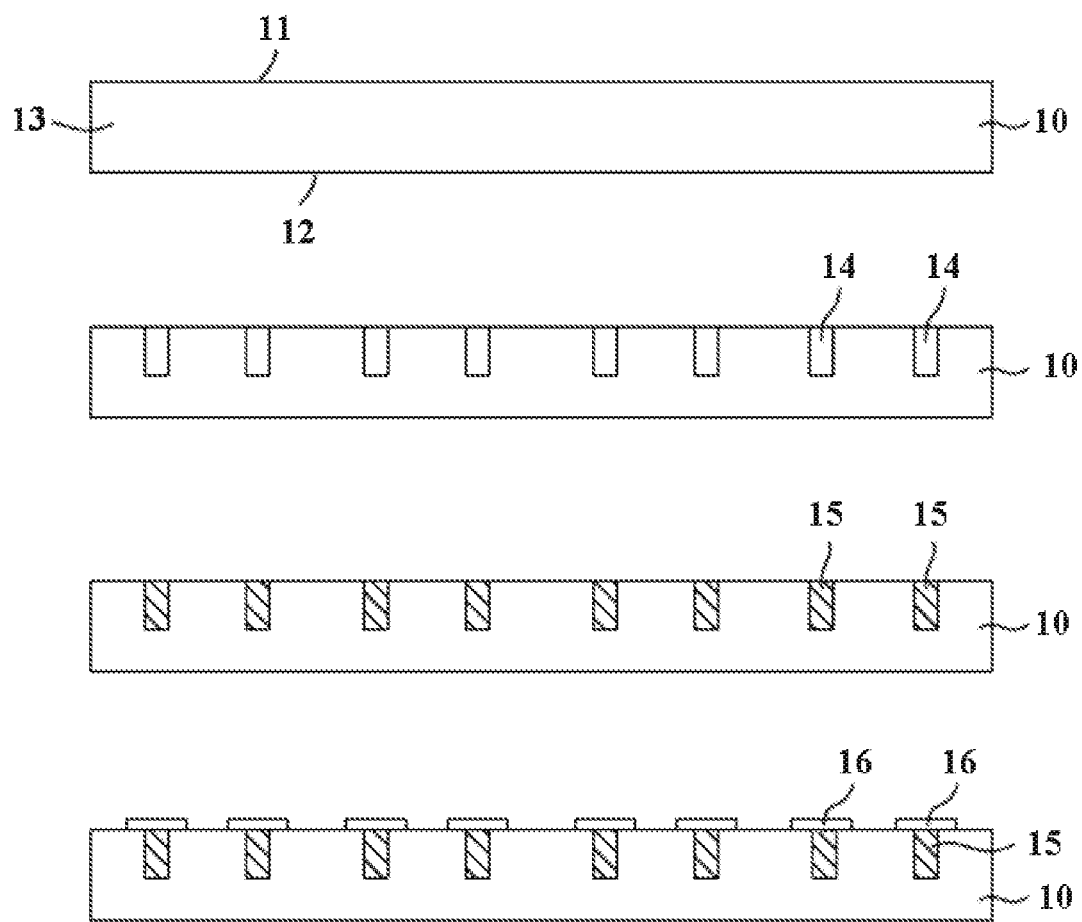
FIG. 6 and FIG. 7 illustrate an exemplary embodiment of a method for manufacturing a supporting substrate for a semiconductor device according to the present disclosure.
Figure 7:
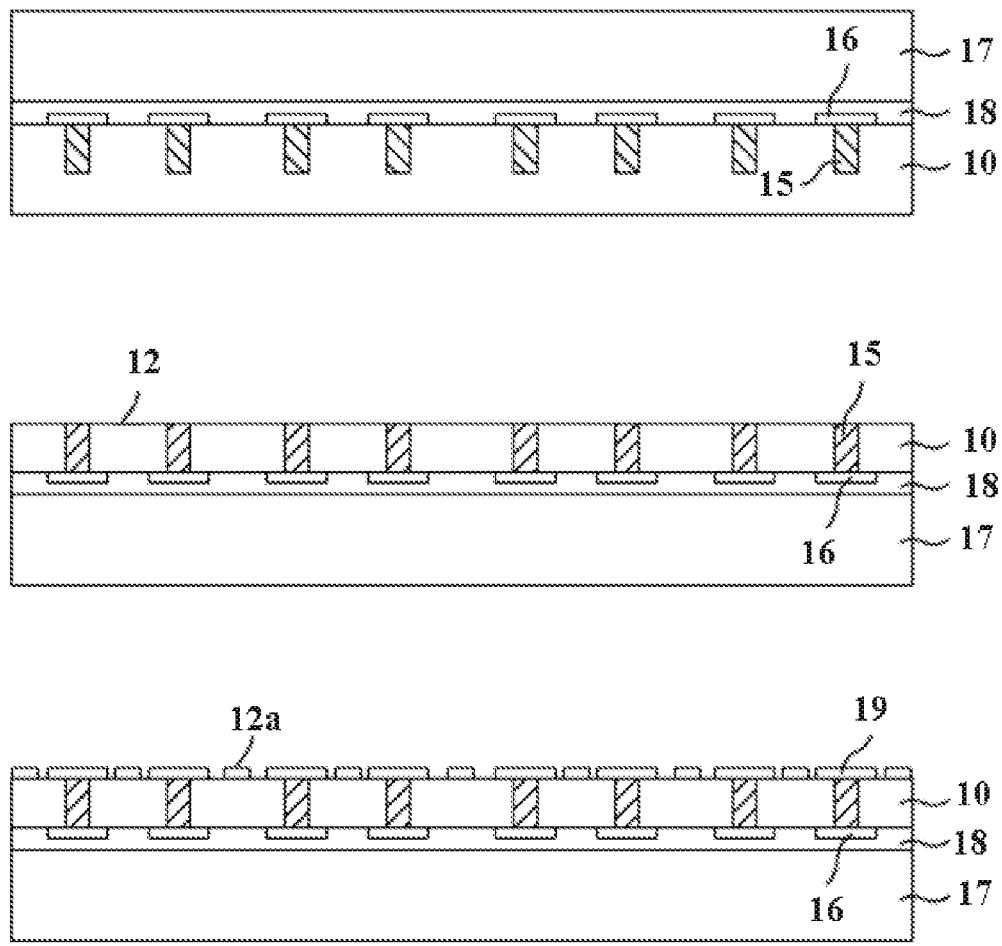

FIG. 6 and FIG. 7 illustrate an exemplary embodiment of a method for manufacturing a supporting substrate for a semiconductor device according to the present disclosure. As shown in FIG. 6, a first substrate 10 is provided. The first substrate 10 has a first face 11, a second face 12, and lateral faces 13 connecting the first face 11 and the second face 12. Next, grooves 14 are formed on the side of the first face 11. The shape of the grooves 14 is not particularly limited, and any shape including a circle, a polygon, a slit or a trench may be used. The groove may be formed in an elongated shape or an individual concave recess. A conducting part 15 is formed in each groove 14. Preferably, a conducting pad 16 is placed on the conducting part 15. The conducting part 15 and the conducting pad 16 may be formed by separate processes or a single process.

To continue, as shown in FIG. 7, a second substrate 17 is bonded to the first substrate 10 using a bonding layer 18. The second face 12 is then subjected to polishing to make the first substrate 10 thinner. Preferably, a conducting pad 19 is placed on the conducting part 15. When the second substrate 17 has adhesive properties such that it can directly be adhered onto the first substrate 10, the bonding layer 18 may be omitted. If applicable, a reflective or insulating layer 12a may be formed on the first substrate before or after the conducting pad 19 is formed.

Figure 1:
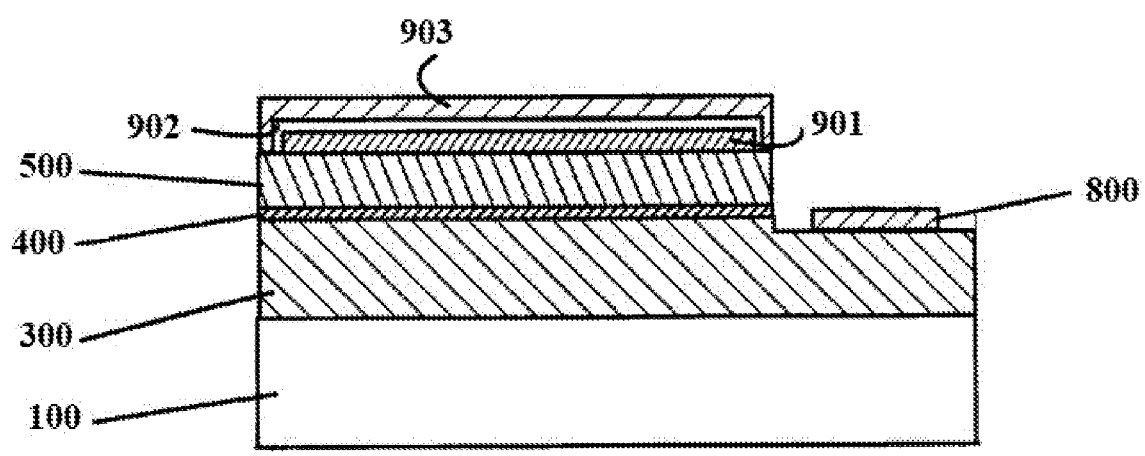
FIG. 1 illustrates an exemplary embodiment of the semiconductor LED chip disclosed in U.S. Pat. No. 7,262,436.
Figure 2:
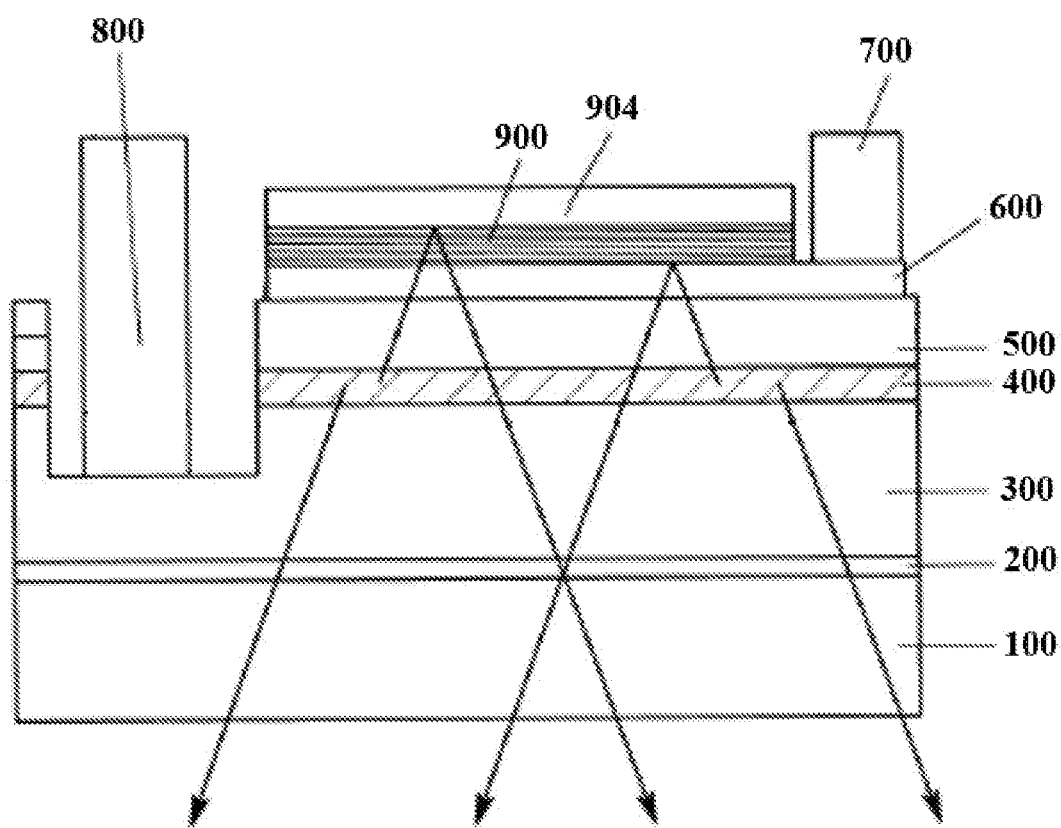
FIG. 2 illustrates an exemplary embodiment of the semiconductor LED chip disclosed in JP Laid-Open Pub. No. 2006-120913.
Figure 3:
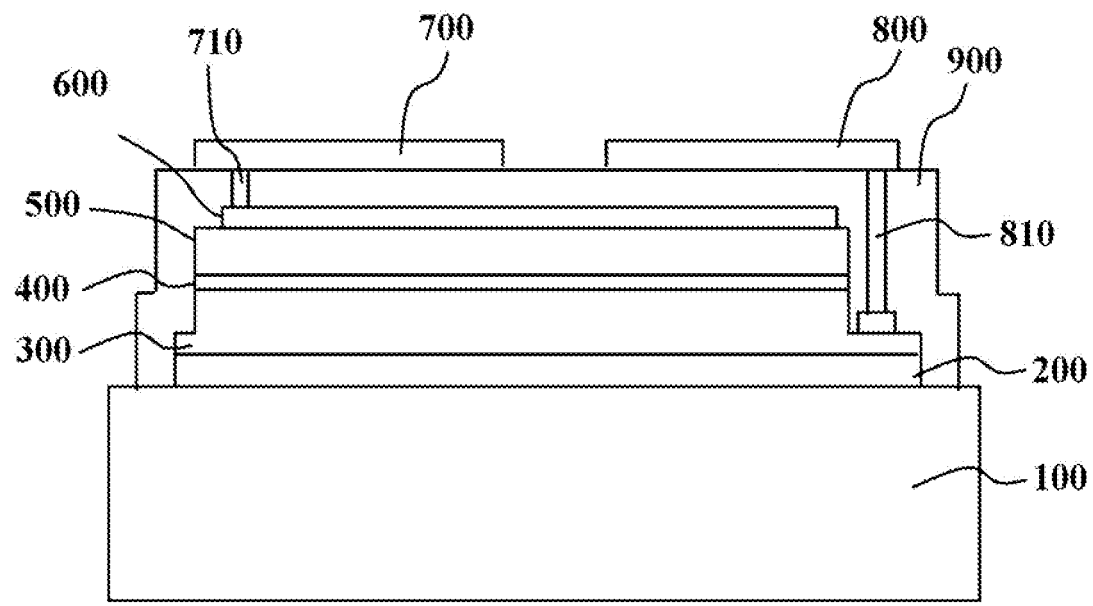
FIG. 3 illustrates an exemplary embodiment of the semiconductor LED chip disclosed in PCT Pub. No. WO2014/014298.
Figure 4:
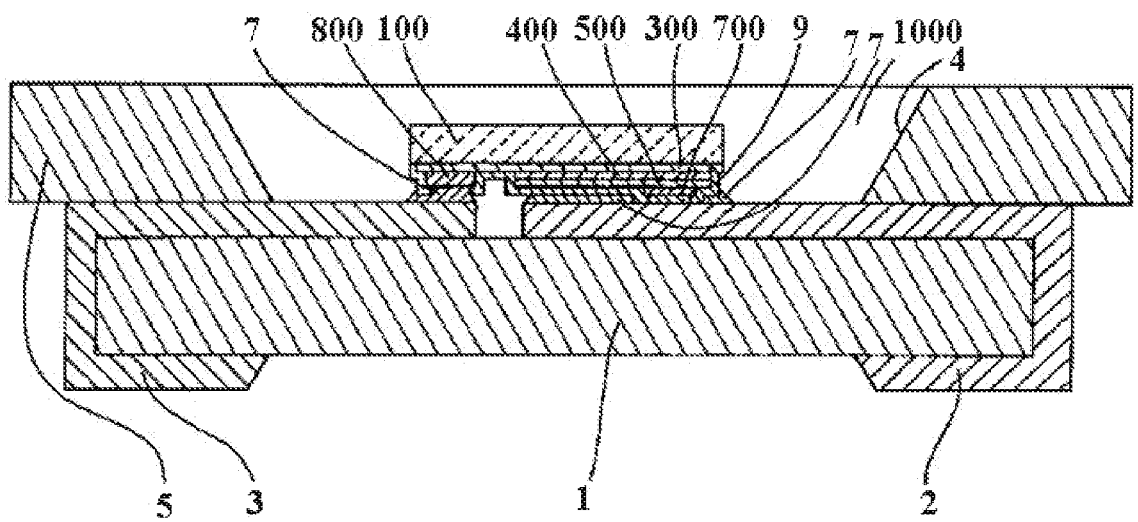
FIG. 4 illustrates an exemplary embodiment of the semiconductor light emitting device disclosed in JP Laid-Open Pub. No. 2001-358371.
Figure 5:
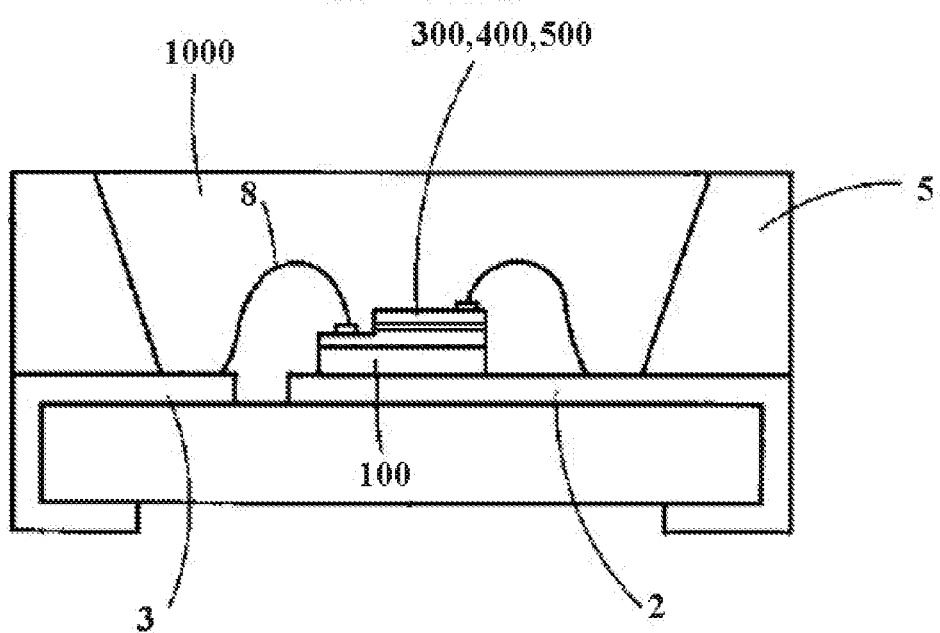
FIG. 5 illustrates an exemplary embodiment of a semiconductor light emitting device in the prior art.
Figure 8:
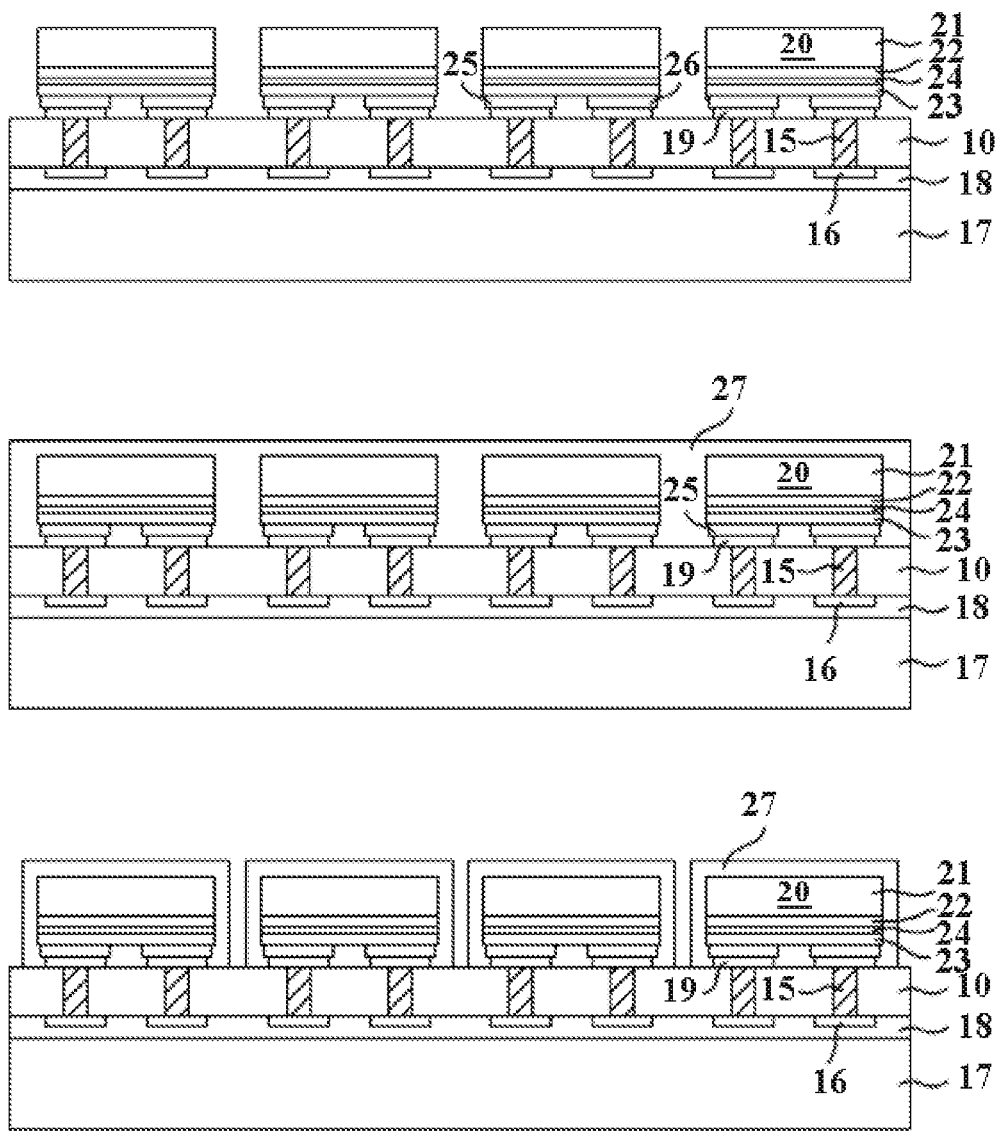
FIG. 8 and FIG. 9 illustrate an exemplary embodiment of a method for manufacturing a semiconductor apparatus according to the present disclosure.
Figure 9:
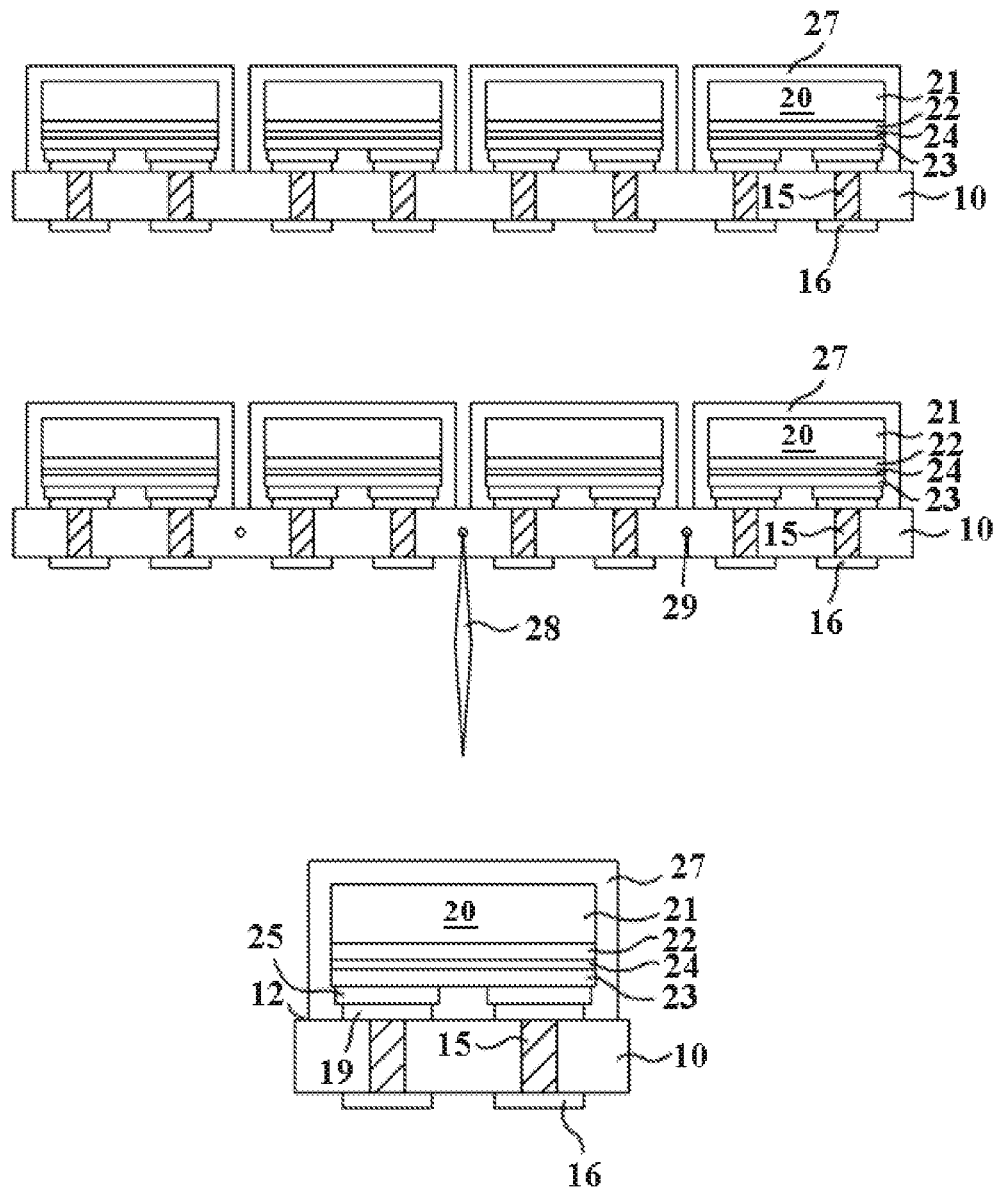

FIG. 8 and FIG. 9 illustrate an exemplary embodiment of a method for manufacturing a semiconductor apparatus according to the present disclosure, in which a semiconductor light emitting device is taken as an example. Referring to FIG. 8, a semiconductor LED chip 20 is fixed to a first substrate 10. The semiconductor LED chip 20 includes a growth substrate 21 (e.g., $Al_2O_3$), a first semiconductor layer 22 having a first conductivity type (e.g., an n-type GaN), a second semiconductor layer 23 having a second conductivity type different from the first conductivity type (e.g., a p-type GaN), an active layer 24 (e.g., an InGaN/(In)(Al)/GaN multiple quantum well structure) which is interpositioned between the first semiconductor layer 22 and the second semiconductor layer 24 and generates light by electron-hole recombination, and first and second electrodes 25 and 26 electrically connected to the first and second semiconductor layers 22 and 23, respectively. This semiconductor LED chip 20 can be one of the semiconductor LED chips shown in FIG. 1 through FIG. 3, and is not particularly limited, provided it is a flip chip. The first electrode 25 and the second electrode 26 are fixed to their corresponding conducting parts 15. The conducting part 15 may serve as an electrical and thermal path. Preferably, an encapsulant 27 is provided to cover the semiconductor LED chip 20. As well understood to those skilled in the art, the encapsulant 27 may include a phosphor and/or a light scattering agent. Preferably, a portion of the encapsulant 27 is removed so as to expose a lateral face of the encapsulant 27. This operation is carried out to facilitate a subsequent cutting operation (to be described), or simply to make the encapsulant 27 have a shape conforming to the semiconductor LED chip 20. The portion of the encapsulation 27 may be removed by cutting, sawing or the like. In an alternative example, before covering the semiconductor LED chip 20 with an encapsulant 27, a frame having the shape of a partially cut encapsulant 27 may be placed on the first substrate 10 in advance, and then the encapsulant 27 is provided. In an alternative example, instead of one-to-one correspondence between each electrode 25, 26 and the conducting part 15, one electrode may be bonded to a plurality of conducting parts 15. The electrode 25, 26 and the conducting part 15, or the electrode 25, 26 and the conducting pad 19 are first aligned before they are bonded together by thermal compression.

To continue, as shown in FIG. 9, a second substrate 17 is separated from the first substrate 10. Following this, the first substrate 10 is cut in a way that the semiconductor LED chip 20 is included. Preferably, a laser beam 28 is radiated into the first substrate 10 to create a crack 29, and the first substrate 10 is then cut by a breaking operation such that the first substrate 10 can be cut with less mechanical, chemical and/or thermal damage to the semiconductor LED chip 20 as well as the encapsulant 27. Alternatively, a mechanical cutting technique such as sawing may be employed to cut the first substrate 10 without having the second substrate 17 separated from the first substrate 10. Although the second substrate 17 may be cut together with the first substrate 17, it is more advantageous in terms of the overall process to cut the first substrate 10 first and then the second substrate 17. One way of separating the second substrate 17 from the first substrate 10 is to remove the bonding layer 18 by etching, for example, to separate those two substrates apart. In the embodiment shown in FIG. 9, a portion of the second face 12 of the first substrate 10 is exposed, and the conducting part 15 together with the conducting pad 19 are covered with the encapsulant 27.

Figure 10:
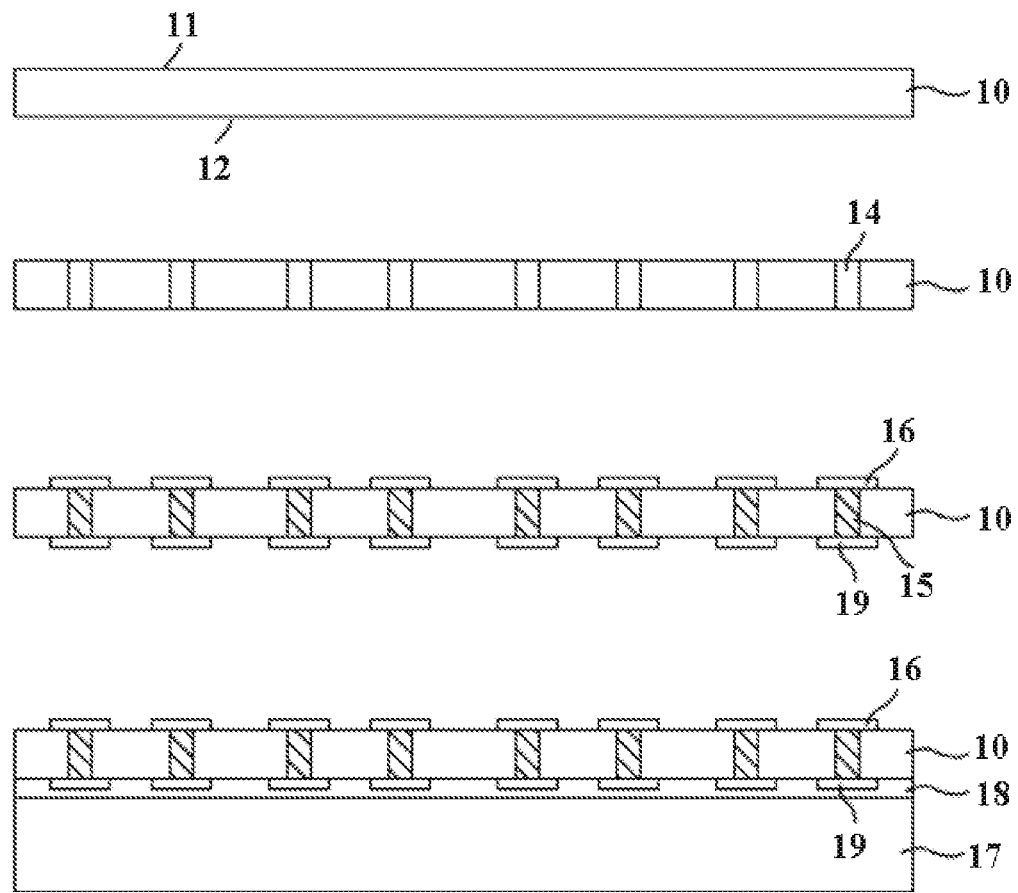
FIG. 10 illustrates another exemplary embodiment of a method for manufacturing a supporting substrate for a semiconductor device according to the present disclosure.

FIG. 10 illustrates another exemplary embodiment of a method for manufacturing a supporting substrate for a semiconductor device according to the present disclosure. Here, prior to bonding a second substrate 17 to a first substrate 10, a groove 14 passing through the first substrate 10 is formed, followed by the formation of a conducting part 15 in a corresponding groove 14. The second substrate 17 is then bonded to the first substrate 10 using a bonding layer 18. The subsequent operations are identical with those described in FIGS. 8 and 9. A conducting pad 16, 19 is preferably formed on at least one side of the conducting part 15. In an alternate embodiment, a groove 14 is formed in the first substrate 10, but not penetrating all the way through the first substrate 10. After a conducting part 15 is formed in the groove 14, a polishing operation is carried out such that the groove 14 penetrates the first substrate 10.

Figure 11:
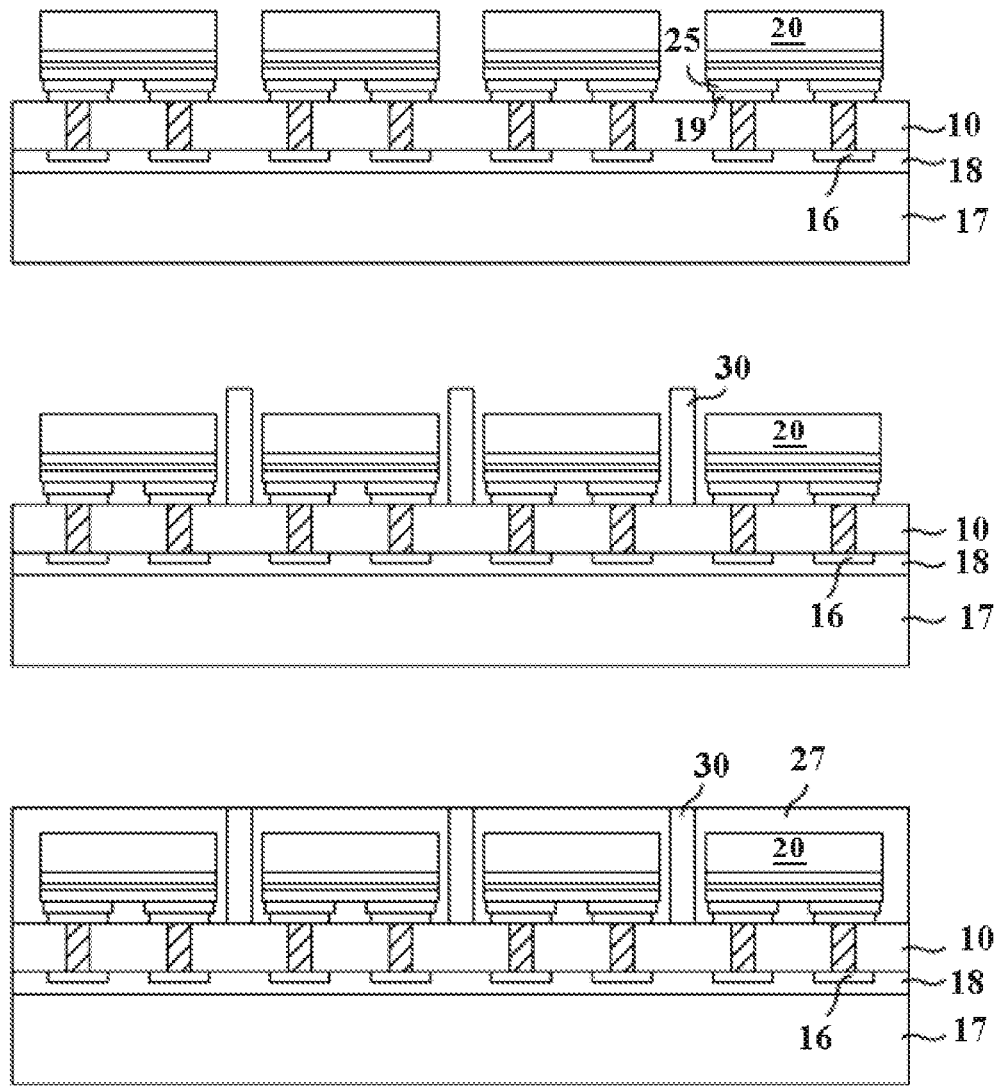
FIG. 11 and FIG. 12 illustrate another exemplary embodiment of a method for manufacturing a semiconductor apparatus according to the present disclosure.
Figure 12:
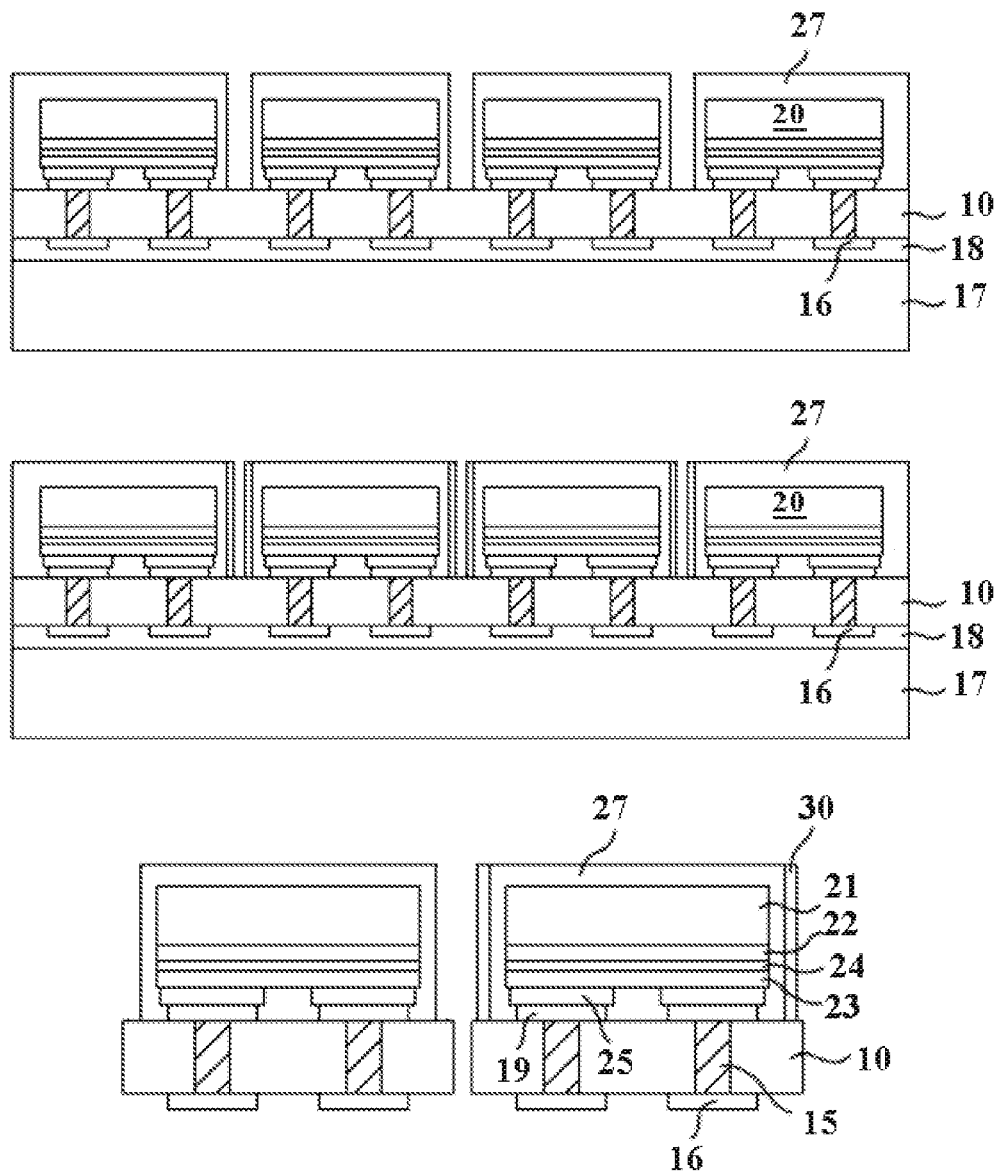

FIG. 11 and FIG. 12 illustrate another exemplary embodiment of a method for manufacturing a semiconductor apparatus according to the present disclosure, in which a semiconductor light emitting device is taken as an example. Referring to FIG. 11, a semiconductor LED chip 20 is fixed to a first substrate 10, and a dam 30 is formed next to the semiconductor LED chip 20. Next, an encapsulant 27 is provided to cover the semiconductor LED chip 20. The dam 30 may serve as a reflective film.

To continue, as shown in FIG. 12, all of part of the dam 30 is removed. With the dam 30 being made from a material such as a photoresist (PSR), it is easier to create a pattern or to remove. In an alternative example, a sawing operation may be carried out to leave a portion of the dam 30. In another alternative example, the dam 30 may be made from a white organic compound (including a $TiO_2$ or $SiO_2$ component, for example) serving as a reflective film.

Figure 13:
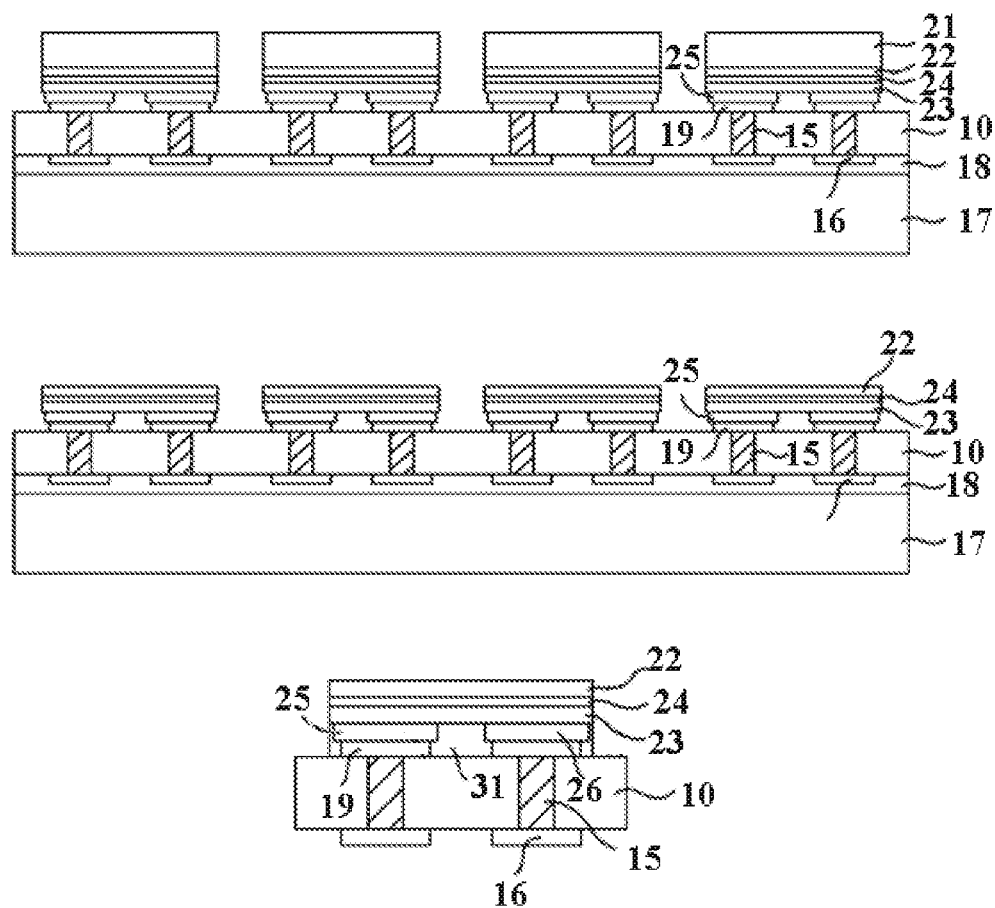
FIG. 13 illustrates another exemplary embodiment of a method for manufacturing a semiconductor apparatus according to the present disclosure.

FIG. 13 illustrates another exemplary embodiment of a method for manufacturing a semiconductor apparatus according to the present disclosure, in which a semiconductor light emitting device is taken as an example. A growth substrate 10 is separated from a plurality of semiconductor layers 22, 23 and 24, before a first substrate 10 and a second substrate 17 are separated apart from each other. Preferably, a space between a first electrode 25 and a second electrode 26 is filled with an insulator 31. More preferably, an entire space between the second semiconductor layer 23 and the first substrate 10 is filled with the insulator 31. This space-filling operation may be performed during the manufacture of a semiconductor LED chip 20, or before the semiconductor LED chip 20 is fixed to the first electrode 10. In an alternative example, a structure (not shown) including a phosphor and/or light scattering agent may be formed directly or indirectly on top of the first semiconductor layer 22 using a transparent adhesive.

Figure 14:
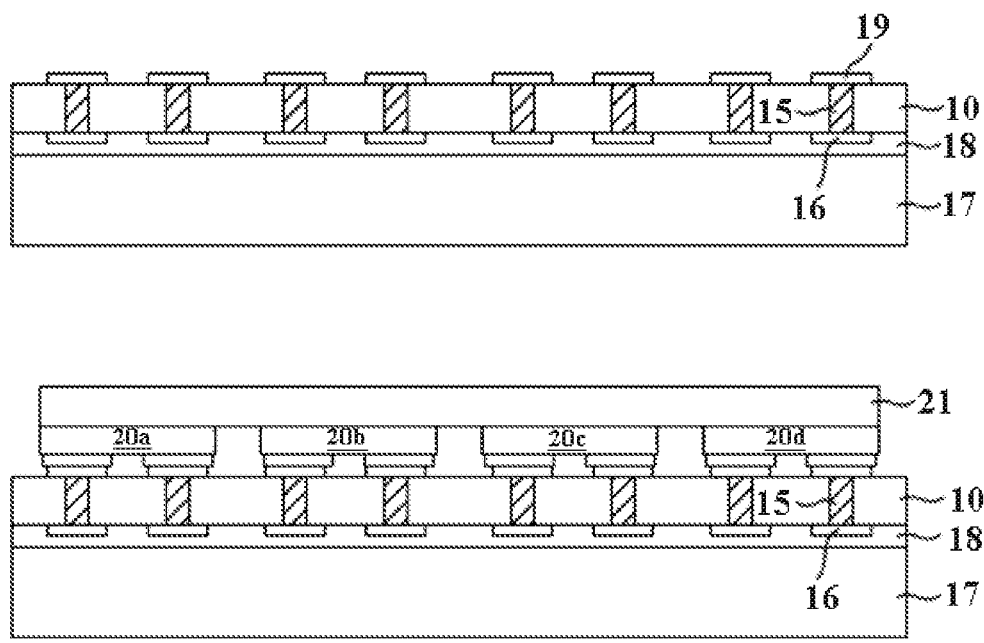
FIG. 14 illustrates another exemplary embodiment of a method for manufacturing a semiconductor apparatus according to the present disclosure.

FIG. 14 illustrates another exemplary embodiment of a method for manufacturing a semiconductor apparatus according to the present disclosure, in which a semiconductor light emitting device is taken as an example. Instead of fixing individual semiconductor LED chip 20 to a first substrate 10 as in FIG. 8, a plurality of semiconductor LED chips 20a, 20b, 20c and 20d is fixed to the first substrate 10 by means of a single growth substrate 21. The plurality of semiconductor LED chips 20a, 20b, 20c and 20d may be connected to each other in parallel, in series or in series-parallel, by wires.

Figure 15:
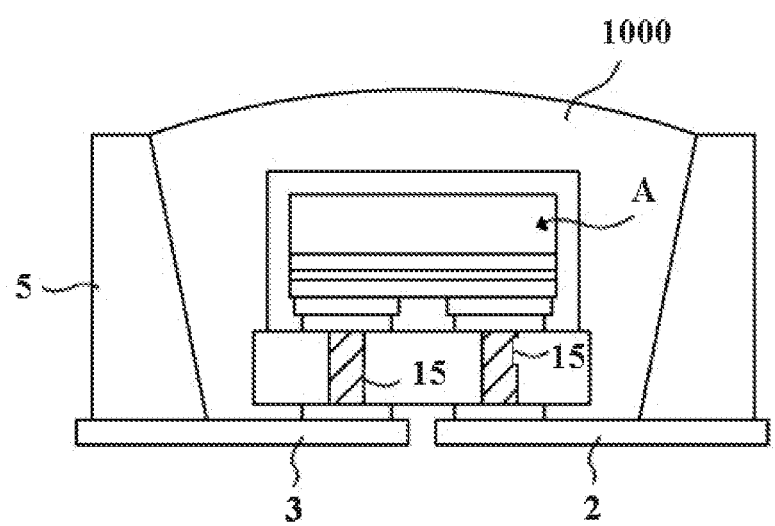
FIG. 15 illustrates an exemplary embodiment of a semiconductor apparatus according to the present disclosure.

FIG. 15 illustrates an exemplary embodiment of a semiconductor apparatus according to the present disclosure, in which a semiconductor light emitting device is taken as an example. The semiconductor light emitting device shown in FIG. 15 includes the semiconductor light emitting device A itself (which is manufactured according to the method described in FIG. 6 through FIG. 9), and further, optionally, lead frames 2 and 3 to which conducing parts 15, 15 are bonded, respectively, an encapsulant 1000 encompassing the semiconductor light emitting device A, and a mold 5 receiving the encapsulating 1000.

Figure 16:
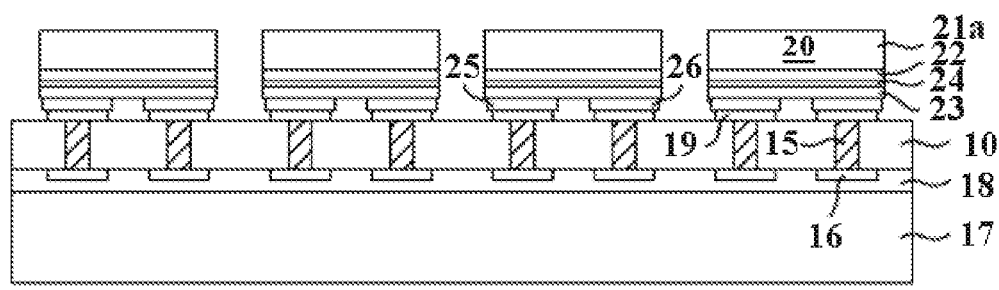
FIG. 16 illustrates another exemplary embodiment of a method for manufacturing a semiconductor apparatus according to the present disclosure.

FIG. 16 illustrates another exemplary embodiment of a method for manufacturing a semiconductor apparatus according to the present disclosure, in which a semiconductor light emitting device is taken as an example. Unlike the semiconductor device described in FIG. 8, this semiconductor device uses a Group-III nitride semiconductor, i.e. Al(x)Ga(y)In(1-x-y)N ($0 \leq x \leq 1$, $0 \leq y \leq 1$, $0 \leq x+y \leq 1$) as a growth substrate 21a (e.g., GaN). In general, semiconductor devices using such a GaN substrate are characterized by a high output, a low operational voltage and low heat generation. However, since they are still very expensive as compared with sapphire substrates, chips are made smaller to compromise the high cost. Additional problems, including chip cracking, limitation on chip size reduction due to electrode size requirements, high heat generated by an increased current density and the like, may also occur. Meanwhile, when a substrate made from GaN having a thermal expansion coefficient of 5.56 ppm is mounted on a lead frame conventionally made from a metal like Cu or Al (for example, a lead frame made from Cu has a thermal expansion coefficient of 16 ppm), a difference in thermal expansion coefficients between a semiconductor chip using a Group-III nitride semiconductor as a growth substrate and a supporting substrate causes a number of mechanical problems. These problems can be overcome by applying a supporting substrate for a semiconductor device, according to the exemplary embodiments described in FIG. 6 through FIG. 15 of the present disclosure. Moreover, with this supporting substrate of the present disclosure, it is possible to prevent a possible damage to a semiconductor chip while being held or gripped. Preferably, a first substrate 10 is made from a material having a thermal expansion coefficient comparable to that of a growth substrate 21a (e.g., they are different preferably by 2 ppm or less), thereby overcoming various mechanical and thermal defects that may occur due to a difference in thermal expansion coefficient. For example, when the growth substrate 21a is made from GaN (5.56 ppm), the first substrate 10 is preferably made from ceramic AlN (4.8 ppm) such that a difference in thermal expansion coefficient between them may be 2 ppm or less, and more preferably 1 ppm. Alternatively, $Al_2O_3$ ceramic having a thermal expansion coefficient of 6.9 to 7.6 ppm can also be applied for the first substrate 10. For brevity of description, common features with like numerals will not be described to avoid redundancy.

Figure 17:
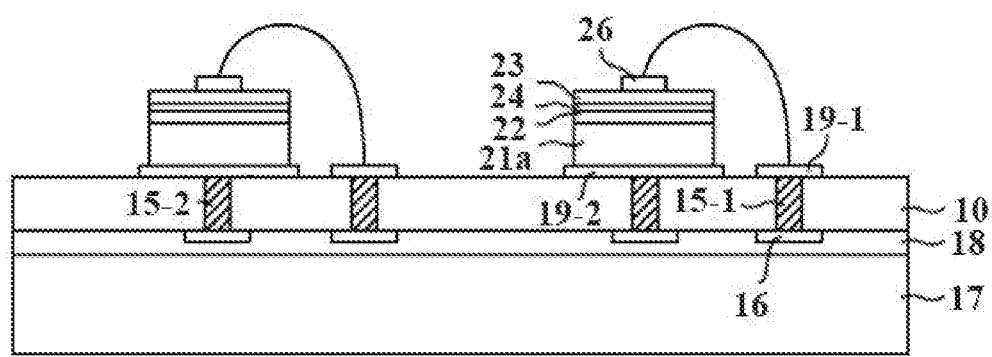
FIG. 17 illustrates an exemplary embodiment of a semiconductor apparatus according to the present disclosure.

FIG. 17 illustrates an exemplary embodiment of a semiconductor apparatus according to the present disclosure, in which a semiconductor light emitting device is taken as an example. A vertical chip using a growth substrate 21a is mounted on a first substrate 10. A second electrode 26 is electrically connected to a second semiconductor layer 23, and to a conducting pad 19-1 and a conducting part 15-1 by wires. A first semiconductor layer 22 is electrically connected to a conducting pad 19-2 and a conducting part 15-2 through the growth substrate 21a. Optionally, an electrode (this corresponds to the first electrode 25) may be arranged under the growth substrate 21a. The growth substrate 21a and the vertical chip may be fixed to each other by any conventional technique. Again, for brevity of description, common features with like numerals will not be described to avoid redundancy.

Figure 18:
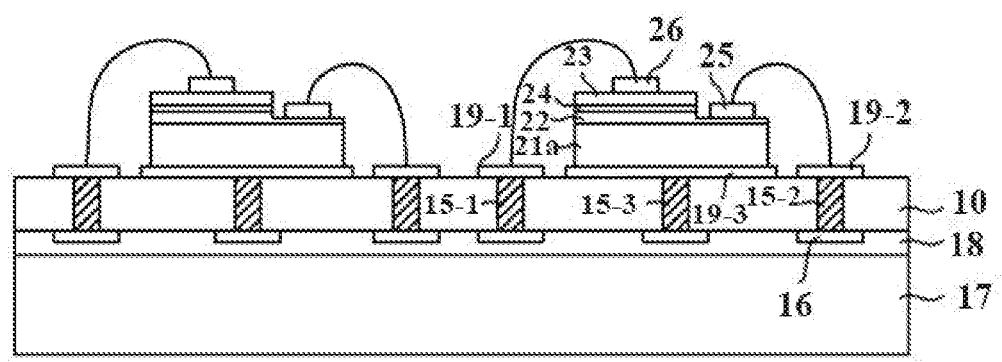
FIG. 18 illustrates another exemplary embodiment of a method for manufacturing a semiconductor apparatus according to the present disclosure.

FIG. 18 illustrates another exemplary embodiment of a method for manufacturing a semiconductor apparatus according to the present disclosure, in which a semiconductor light emitting device is taken as an example. A lateral chip using a growth substrate 21a is mounted on a first substrate 10. A first electrode 25 is electrically connected to a first semiconductor layer 22, and a second electrode 26 is electrically connected to a second semiconductor layer 23. The first electrode is electrically connected to a conducting pad 19-2 and a conducting part 15-2 by wires, and the second electrode 26 is electrically connected to a conducting pad 19-1 and a conducting part 15-1 by wires. Preferably, a conducting pad 19-3 and a conducting part 15-3 are further provided, serving as a heat generation path from the semiconductor chip. If the growth substrate 21a is conductive, a separate insulating layer may be arranged between the conducting pad 19-3 and the growth substrate 21a. Alternatively, a non-conductive material may as well be used for the conducting pad 19-3.

The following will now describe various embodiments of the present disclosure.

(1) A method for manufacturing a semiconductor light emitting device, characterized by including: providing a first substrate, which has a first face and a second face opposite to the first face, and which also has a first groove and a second groove formed in a direction from the first face to the second face, with the first and second grooves each receiving a conducting part so as to control thermal expansion of the conducting part, respectively; bonding a second substrate to the first face of the first substrate by means of a bonding layer; and fixing a semiconductor LED chip to the second face of the first substrate, with the semiconductor light emitting device including a growth substrate, a plurality of semiconductor layers grown on the growth substrate, with the plurality of semiconductor layers including a first semiconductor layer having a first conductivity type, a second semiconductor layer having a second conductivity type different from the first conductivity type, and an active layer interpositioned between the first semiconductor layer and the second semiconductor layer, for generating light by electron-hole recombination, and first and second electrodes electrically connected to the first and second semiconductor layers, respectively, in such a manner that the first electrode and the second electrode are fixed to the conducting part of the first groove and the conducting part of the second groove, respectively.

The first substrate 10 may be composed of any one of the following: a ceramic material, an $Al_2O_3$ crystal, an AlN crystal, HTCC, LTCC, an $Al_2O_3$ mixture or ceramic material, an $Al_2O_3$—$ZrO_2$ mixture or ceramic material, and an AlN mixture or ceramic material.

As the conducting part 15 made from a metallic material is arranged in the groove 14, thermal expansion of the conducting part 14 can be suppressed.

The first substrate 10 has a thickness ranging from 10 to 2000 μm. If the first substrate is too thin, it may not properly function as a supporting substrate. Its thickness is preferably between 30 and 500 μm. Moreover, if the first substrate is too thick, an additional operation (e.g., polishing) may be required later.

For example, the groove 14 may have a width of 30 μm, and a length that varies by a length of the electrode 25, 26. A single electrode 25 may correspond to a plurality of grooves 14. When the groove 14 is formed into a hole, one side of the hole may be 200 μm long or less. The groove 14 preferably has a width ranging from 30 to 200 μm. If it is too narrow, heat generation properties may not be satisfactory; if it is too broad, the first substrate 10 may be broken. Basically, the groove 14 may have a varying size depending on a shape of the electrode 25, 26. By way of example only, the groove 14 may have a depth that is approximately 10% greater than the thickness of the first substrate 10 after it has been polished.

The conducting part 15 including the conducting pad 16 may be obtained by forming a seed layer using an E-beam or sputter and then plating the seed layer. Examples of a suitable plating material include Cu, Ni, Au, Ag, In and Sn. Alternatively, an Ag or Cu-based conductive paste may be used. In another alternative example, an electrically conductive paste containing graphite, CNT, AlN or SiC may also be used. The conducting pad 16 may be made from any one of Au, Ag, Pt, Pd, Cu, Ni, Cr, Sn, In, Zn, Ti, and TiW, or any combination thereof, in form of multiple layers of these materials. The conducting pad 16 may be formed together with the conducting part 15, or separately. Also, the conducting pad 16 may be formed of an Ag or Cu-based conductive paste. Optionally, the conducting part 15 and/or the conducting pad 16 may be formed after the first and second substrates 10 and 17 are first bonded to each other. In an alternative example, a portion of the conducting part 15 may be first formed by plating, and the rest of the conducting part 15 may be filled with a conductive paste. This combined use of a conductive paste is effective for achieving high electrical conductivity as well as for suppressing thermal expansion of the plated metal itself, despite the fact that the plated metal has a low electric resistance.

The second substrate 17 may be made from an electrical insulation material, and examples thereof include glass, sapphire, an $Al_2O_3$ mixture, an $Al_2O_3$—$ZrO_2$ mixture, an AlN mixture, silicon or ceramic oxides. The second substrate 17 may be bonded to the first substrate by means of a bonding layer 18, or by deposition. The second substrate 17 thus formed is then removed later by etching. The first and second substrates 10 and 17 are preferably made from the same material such that they have equivalent thermal expansion coefficients. For example, both the first substrate 10 and the second substrate 17 may be made from sapphire.

Preferably, a plurality of semiconductor light emitting device (LED) chips 20 is fixed at regular intervals.

Optionally, an insulator is arranged between the first electrode 25 and the second electrode 26. Examples of the insulator include a thermosetting resin, a thermoplastic resin, a phenol resin, an epoxy resin, a BT resin, PPA, and a silicon resin.

(2) The method for manufacturing a semiconductor light emitting device further includes: prior to fixing, reducing a thickness of the first substrate, while the first substrate is being bonded to the second substrate.

(3) In the method for manufacturing a semiconductor light emitting device, a reduced thickness of the first substrate ranges from 30 to 500 μm. If the first substrate is too thin, it cannot serve as a supporting substrate; if it is too thick, it makes a cutting operation more difficult and does not easily fit in a package as described in FIG. 15.

(4) The method for manufacturing a semiconductor light emitting device further includes: prior to fixing, forming a conducing pad on the conducing part on the side of the second face.

The conducting pad 19 may be formed by plating or deposition. The conducting pad 19 may be made from any one of Au, Ag, Pt, Pd, Cu, Ni, Cr, Sn, In, Zn, Ti, and TiW, or any combination thereof, in form of multiple layers of these materials. Alternatively, the conducting pad 19 may be formed of an Ag or Cu-based, electrically conductive paste. Further, a reflective or insulating layer 12a may be formed on the first substrate between the conducting pads 19. When the reflective layer 12a is applicable, it may be made from a material having high reflectivity, which includes Ag, Al, Rh, Cr, Ti, TiW, Au, DBR and OBR, for example. When the insulating layer 12a is applicable, it may be made from $SiO_2$, $TiO_2$, $ZrO_2$, $Al_2O_3$, DBR, SOG (Spin On Gel), epoxy or a resin, for example. When this reflective or insulating layer 12a serves as an insulating layer for its neighboring conducting pads 19 arranged on either side, the insulating layer 12a preferably has a height greater than that of the conducing pads 19.

(5) The method for manufacturing a semiconductor light emitting device further includes: forming an encapsulant over the second face, for covering the semiconductor light emitting chips.

The encapsulant may include a phosphor and/or a light scattering agent, and may be formed into a single layer or multiple layers, with each layer being transparent or containing a different kind of phosphor.

(6) In the method for manufacturing a semiconductor light emitting device, forming an encapsulant involves exposing a lateral face of the encapsulant.

For example, a portion of the encapsulant 27 may be removed using a laser beam or by a dicing or cutting process.

(7) The method for manufacturing a semiconductor light emitting device further includes: separating the second substrate from the first substrate.

The second substrate 17 may be removed by polishing or wet etching. When the bonding layer 18 or the second substrate 17 is made from a light reactive material, they can be removed by an optical method (e.g., light).

(8) In the method for manufacturing a semiconductor light emitting device, separating the substrates involves removing the bonding layer.

A tape may be used for the bonding layer 18. Alternatively, the bonding layer 18 may be provided by depositing a metal, an oxide or a nitride and then removing it by etching. The bonding layer 18 may also be made from a material that is heal-releasable, thermally-chemically decomposable, photo-chemically decomposable, or photo-thermally-chemically decomposable.

(9) The method for manufacturing a semiconductor light emitting device further includes: cutting the first substrate in a way that the semiconductor LED chip is included.

The encapsulant 27 does not necessarily have only one semiconductor LED chip 20 therein. In fact, it can have multiple semiconductor LED chips 20 therein, and these semiconductor LED chips 20 do not necessarily have to emit the same color of light as they can emit various colors of light, e.g., blue, green or ultraviolet. Moreover, it can also have an ESD protection element.

Cutting is carried out using laser ablation, a dicing saw or the like.

(10) The method for manufacturing a semiconductor light emitting device further includes: prior to cutting, creating a crack in the first substrate.

The crack can be created using so-called a stealth laser.

(11) In the method for manufacturing a semiconductor light emitting device, a conducting pad is formed on at least one of the first and second face sides of the conducting part.

(12) In the method for manufacturing a semiconductor light emitting device, a plurality of conducting parts is fixed to the first electrode or the second electrode.

(13) The method for manufacturing a semiconductor light emitting device further includes: forming an encapsulant on the side of the second face, for covering the semiconductor LED chip; and cutting the first substrate in a way that the semiconductor LED chip is included, wherein, after cutting, a portion of the second face of the first substrate is exposed, without being covered by the encapsulant.

It is desirable that this exposed area should not be longer than 100 µm. If the area is too broad, a large amount of material can be lost. In case of using a stealth laser, a gap between the chips is suitably 30 µm for performing a corresponding process.

(14) In the method for manufacturing a semiconductor light emitting device, while providing the first substrate, a conducting pad is formed on at least one of the first and second face sides of the conducting part.

(15) The method for manufacturing a semiconductor light emitting device further includes: forming an encapsulant on the side of the second face, for covering the semiconductor LED chip; and prior to forming the encapsulant, forming a dam next to the semiconductor LED chip on the side of the second face of the first substrate.

The dam 30 may be formed of a PR or a dry film. It may also serve as a reflective film, and may include EMC, white silicone, or $TiO_2$-containing silicone, for example.

(16) The method for manufacturing a semiconductor light emitting device further includes: cutting the first substrate in a way that the semiconductor LED chip is included; and prior to cutting, removing a portion of the dam.

(17) The method for manufacturing a semiconductor light emitting device further includes: separating the second substrate from the first substrate; and prior to separating the second substrate, separating the growth substrate from the plurality of semiconductor layers.

(18) In the method for manufacturing a semiconductor light emitting device, fixing involves filling a space between the first electrode and the second electrode with an insulator.

(19) The method for manufacturing a semiconductor light emitting device further includes: prior to fixing, filling a space between the first electrode and the second electrode with an insulator.

(20) In the method for manufacturing a semiconductor light emitting device, fixing involves fixing a plurality of semiconductor LED chips including said semiconductor LED chip to the first substrate.

(21) In the method for manufacturing a semiconductor light emitting device, the first substrate and the growth substrate are made from the same material.

Most preferably, the first substrate and the growth substrate are made from the same material, but they may be made from materials having comparable thermal expansion coefficients (e.g., $Al_2O_3$ and AlN).

(22) In the method for manufacturing a semiconductor light emitting device, the first substrate is made from a light transmitting material. In that case, the first substrate can be obtained by a stealth laser process.

(23) A semiconductor light emitting device including: a semiconductor LED chip, which comprises: a growth substrate, a plurality of semiconductor layers grown on the growth substrate, with the plurality of semiconductor layers including a first semiconductor layer having a first conductivity type, a second semiconductor layer having a second conductivity type different from the first conductivity type, and an active layer interpositioned between the first semiconductor layer and the second semiconductor layer, for generating light by electron-hole recombination, and first and second electrodes electrically connected to the first and second semiconductor layers, respectively; and a first substrate, which has a first face and a second face opposite to the first face, and which also has a first groove and a second groove formed in a direction from the first face to the second face, with the first and second grooves each receiving a conducting part so as to control thermal expansion of the conducting part, respectively, wherein the first substrate has light transmitting properties, and the first and second electrodes are fixed to the conducting parts in the first and second grooves, respectively.

(24) In the semiconductor light emitting device, the first substrate and the growth substrate are made from the same material.

(25) In the semiconductor light emitting device, the semiconductor LED chip has lateral faces connecting the first face and the second face, and the lateral faces have a rugged surface away from the first and second faces, with the rugged surface being formed by a crack created by laser radiation.

(26) A semiconductor light emitting device including: a semiconductor LED chip, which comprises a plurality of semiconductor layers grown on a growth substrate, with the plurality of semiconductor layers including a first semiconductor layer having a first conductivity type, a second semiconductor layer having a second conductivity type different from the first conductivity type, and an active layer interpositioned between the first semiconductor layer and the second semiconductor layer, for generating light by electron-hole recombination, and first and second electrodes electrically connected to the first and second semiconductor layers, respectively; and a first substrate, which has a first face, a second face opposite to the first face, and lateral faces connecting the first face and the second face and having a rugged surface away from the first and second faces, with the rugged surface being formed by a crack created by laser radiation, and which also has a first groove and a second groove formed in a direction from the first face to the second face, with the first and second electrodes being fixed to the conducting parts in the first and second grooves, respectively.

(27) The semiconductor light emitting device further includes: a first lead frame, to which the conducting part received in the first groove is fixed; a second lead frame, to which the conducting part received in the second groove is fixed; and an additional encapsulant for encompassing semiconductor LED chips and the first substrate.

(28) A method for manufacturing a semiconductor light emitting device, the method including: bonding a second substrate to a first substrate; fixing, to the first substrate, a semiconductor LED chip including an active layer for generating light by electron-hole recombination; separating the second substrate from the first substrate; creating a crack in the first substrate; and cutting the first substrate in a way that the semiconductor LED chip is included.

(29) A method for manufacturing a semiconductor light emitting device, the method including: providing a first substrate, which is bonded to a second substrate and has a crack therein; fixing, to the first substrate, a semiconductor LED chip including an active layer for generating light by electron-hole recombination; separating the second substrate from the first substrate; and pressing and cutting the first substrate along the crack.

(30) The method for manufacturing a semiconductor light emitting device further includes: prior to fixing, forming a reflective layer on the side of the second face of the first substrate. When the reflective film is made from a conductive material, it is arranged at a distance from a conducting part 15 or a conducting pad 19.

(31) A method for manufacturing a semiconductor light emitting device, the method including: providing a first substrate having a first face and a second face opposite to the first face; forming a groove in the first substrate in a direction from the first face to the second face; forming a conducting part in the groove; bonding a second substrate to the first face of the first substrate; and forming, on the second face, a first conducting pad to be in electrical communication with the conducting part.

(32) A method for manufacturing a supporting substrate for a semiconductor device, the method including: providing a first substrate having a first face and a second face opposite to the first face; forming a groove in the first substrate in a direction from the first face to the second face; forming a conducting part in the groove; forming at least one conducting pad on the conducting part; and bonding a second substrate to the first face of the first substrate.

(33) A semiconductor apparatus including: a semiconductor device grown using a Group-III nitride semiconductor having a first thermal expansion coefficient as a growth substrate; and a first substrate, which is bonded to the semiconductor device and has a second thermal expansion coefficient different from the first thermal expansion coefficient by 2 ppm or less, with the first substrate having a conducting part adapted to pass through the first substrate so as to provide the semiconductor device with an electrical path.

(34) A semiconductor apparatus including: a semiconductor device grown using a growth substrate made from GaN; and a first substrate, which is made from AlN and bonded to the semiconductor device, with the first substrate having a conducting part adapted to pass through the first substrate so as to provide the semiconductor device with an electrical path. The first substrate can be made from an AlN mixture, an AlN single crystal, or a combination thereof.

(35) A semiconductor apparatus including: a semiconductor device grown using a Group-III nitride semiconductor as a growth substrate; and a first substrate, which is bonded to the semiconductor device has a conducting part adapted to pass through the first substrate so as to provide the semiconductor device with an electrical path, with the first substrate having a first face, a second face opposite to the first face, and lateral faces connecting the first face and the second face, wherein the semiconductor device is bonded to the side of the second face, and the lateral faces have a rugged surface away from the first and second faces and resulted from a crack created by laser radiation.

(36) A method for manufacturing a semiconductor apparatus, the method including: providing a first substrate having a first face and a second face opposite to the first face; forming a groove in the first substrate in a direction from the first face to the second face; forming a conducting part in the groove; bonding a second substrate to the first face of the first substrate; and bonding a semiconductor device to the first substrate for electrical communication with the conducting part, with the semiconductor device being grown using a Group-III nitride semiconductor as a growth substrate.

(37) A semiconductor apparatus including: a semiconductor device grown using a Group-III nitride semiconductor having a first thermal expansion coefficient as a growth substrate; and a first substrate, which is bonded to the semiconductor device and has a second thermal expansion coefficient lower than the first thermal expansion coefficient (e.g., an AlN mixture), with the first substrate having a conducting part adapted to pass through the first substrate so as to provide the semiconductor device with an electrical path.

(38) A semiconductor apparatus including: a first substrate; and a vertical chip which is mounted on the first substrate and grown on a heterogeneous substrate (e.g., a sapphire substrate) as a growth substrate, wherein the growth substrate is removed after the chip is grown.

A supporting substrate for a semiconductor device according to an exemplary embodiment of the present disclosure is capable of protecting a semiconductor device chip from cracking or breaking.

A semiconductor apparatus according to an exemplary embodiment of the present disclosure includes semiconductor device chips that are protected from cracking or breaking.

A method for manufacturing a semiconductor apparatus according to an exemplary embodiment of the present disclosure is intended to prevent semiconductor device chips from cracking or breaking.

What is claimed is:

1. A method for manufacturing a semiconductor light emitting apparatus including a first substrate having a first face and a second face opposite to the first face, a groove in a direction from the first face to the second face and a conducting part in the groove, and a semiconductor light emitting chip bonded to the first substrate, the method comprising:
bonding a second substrate made of sapphire to the first face of the first substrate via a bonding layer made of a light reactive material, the first substrate composed of one of a ceramic material, an $Al_2O_3$ crystal, an AlN crystal, HTCC, LTCC, an $Al_2O_3$ mixture or ceramic material, an $Al_2O_3$—$ZrO_2$ mixture or ceramic material, and an AlN mixture or ceramic material;
bonding a plurality of semiconductor light emitting chips including the semiconductor light emitting chip to the second face of the first substrate in such a manner that the semiconductor light emitting chip is electrically communicated with the conducting part, with the semiconductor light emitting chip having a third substrate made of $Al_2O_3$, in which the second substrate is located opposite the plurality of semiconductor light emitting chips with respect to the first substrate;
separating the second substrate from the first substrate by removing the bonding layer with an optical method; and
cutting the first substrate in such a manner that the semiconductor light emitting chip is included,
wherein the third substrate and the first substrate differ in thermal expansion coefficient by 2 ppm or less.

2. The method according to claim 1, wherein the first substrate is a light transmitting substrate.

3. The method according to claim 1, wherein the first substrate comprises AlN.

4. The method according to claim 1, wherein the first substrate has lateral faces connecting the first face and the second face, and the lateral faces have a rugged surface away from the first and second faces resulting from a crack created by laser radiation.

* * * * *